(12) United States Patent
Kormanyos

(10) Patent No.: US 8,076,224 B2
(45) Date of Patent: Dec. 13, 2011

(54) THIN-FILM DEPOSITION AND RECIRCULATION OF A SEMI-CONDUCTOR MATERIAL

(75) Inventor: Kenneth R. Kormanyos, Berkey, OH (US)

(73) Assignee: Calyxo GmbH, Bitterfeld-Wolfen (DE)

( * ) Notice: Subject to any disclaimer, the term of this patent is extended or adjusted under 35 U.S.C. 154(b) by 210 days.

(21) Appl. No.: 12/633,249

(22) Filed: Dec. 8, 2009

(65) Prior Publication Data

US 2010/0144130 A1 Jun. 10, 2010

Related U.S. Application Data

(60) Provisional application No. 61/120,629, filed on Dec. 8, 2008.

(51) Int. Cl.
*H01L 21/203* (2006.01)
(52) U.S. Cl. ........... 438/503; 438/507; 257/E21.091; 257/E21.462
(58) Field of Classification Search .......... 438/503, 438/507; 257/E21.091, E21.462
See application file for complete search history.

(56) References Cited

U.S. PATENT DOCUMENTS

| | | |
|---|---|---|
| 4,027,206 A | 5/1977 | Lee |
| 4,504,526 A | 3/1985 | Hofer et al. |
| 5,501,744 A | 3/1996 | Albright et al. |
| 5,536,333 A | 7/1996 | Foote et al. |
| 5,994,642 A | 11/1999 | Higuchi et al. |
| 6,676,994 B2 | 1/2004 | Birkmire et al. |
| 7,301,155 B2 * | 11/2007 | Tokuda et al. ........... 250/370.13 |
| 7,335,918 B2 | 2/2008 | Takayama et al. |
| 7,635,647 B2 | 12/2009 | Johnston |
| 7,674,713 B2 * | 3/2010 | Johnston et al. ............ 438/680 |
| 2001/0041463 A1 | 11/2001 | Kakkad |
| 2006/0236939 A1 | 10/2006 | Powell et al. |
| 2006/0236940 A1 | 10/2006 | Powell et al. |
| 2007/0269984 A1 | 11/2007 | Araki |
| 2008/0153268 A1 | 6/2008 | Johnston et al. |
| 2008/0311729 A1 * | 12/2008 | Johnston ................ 438/479 |

OTHER PUBLICATIONS

Chemical Vapor Deposition of Chalcogenide Semiconductors, NTiS, Aug. 1975, U.S. Department of Commerce, National Technical Information Service, ADA017524, Massachusetts Inst of Tech Cambridge Center for Materials Science and Engineering: H. Kent Bowen, et al.

* cited by examiner

*Primary Examiner* — Trung Q Dang
(74) *Attorney, Agent, or Firm* — Fraser Clemens Martin & Miller LLC; J. Douglas Miller

(57) ABSTRACT

A process for coating a substrate at atmospheric pressure is disclosed, the process comprising the steps of vaporizing a mass of semiconductor material within a heated inert gas stream to create a fluid mixture having a temperature above the condensation temperature of the semiconductor material, directing the fluid mixture at the substrate, the substrate having a temperature below the condensation temperature of the semiconductor material thereby depositing a layer of the semiconductor material onto a surface of the substrate, extracting undeposited semiconductor material; and circulating the undeposited semiconductor material into the fluid mixture having a temperature above the condensation temperature.

20 Claims, 2 Drawing Sheets

THIN-FILM DEPOSITION AND RECIRCULATION OF A SEMI-CONDUCTOR MATERIAL

CROSS-REFERENCE TO RELATED APPLICATION

This application claims the benefit of priority of U.S. Provisional Patent Application Ser. No. 61/120,629 filed on Dec. 8, 2008 hereby incorporated herein by reference.

FIELD OF THE INVENTION

The present invention relates generally to the deposition of a vaporized chemical material on a substrate, and more particularly to a process for depositing a recirculated vaporized chemical material and inert gas mixture on a substrate at atmospheric pressure.

BACKGROUND OF THE INVENTION

Chemical vapor deposition processes such as pyrolytic processes and hydrolytic processes are well known in the art of coating substrates. The physical characteristics of the coating reactants utilized in such processes may be a liquid, a vapor, or a solid dispersed in gaseous mixtures, aerosols, or vaporized or vaporous coating reactants dispersed in gaseous mixtures.

In the process of deposition of a vaporized chemical compound on a glass substrate in the production of photovoltaic devices, the vaporized chemical compound is typically deposited in a vacuum atmosphere as described in U.S. Pat. No. 5,248,349 to Foote, et al.; U.S. Pat. No. 5,945,163 to Powell, et al.; and U.S. Pat. No. 6,676,994 to Birkmire, et al. The systems for carrying out such process have typically included a housing having an enclosed deposition chamber that includes a vacuum source for drawing a vacuum within the deposition chamber. The vacuum deposition chamber typically includes heaters for heating the glass sheets as they are passed through the system. The glass sheets pass into the deposition chamber from a vacuum-heating furnace to the vacuum deposition chamber that is maintained at a similar vacuum and temperature setting as the heating furnace.

Powdered cadmium sulfide and powdered cadmium telluride are fed into the vaporization deposition chamber. The films are then deposited onto the previously coated and heated glass substrates sequentially. The cadmium telluride thin-film material requires a follow-on processing step to re-crystallize its polycrystalline structure so that effective photovoltaic devices can be made from the film stack.

Another method of depositing a vaporized chemical compound on a glass substrate for the production of photovoltaic devices is disclosed in commonly owned U.S. patent application Ser. No. 11/573,768 for ATMOSPHERIC PRESSURE CHEMICAL VAPOR DEPOSITION to Johnston in which the deposition occurs at atmospheric pressure within a heated inert gas filled furnace as the glass is passed through the furnace. Individually metered masses of semiconductor material, preferably cadmium sulfide (CdS) or cadmium telluride (CdTe) in powdered form, are introduced into a zone which is continuously purged by a stream of inert gas, preferably nitrogen, flowing between an inlet and an outlet at approximately atmospheric pressure. The powder is carried from the inlet, by the inert gas flowing at a controlled rate, into a heated vaporizer consisting of a refractory material. In the vaporizer, the powder is vaporized to form a mixture of the hot inert gas and the vaporized powder material. The outlet of the heated vaporizer is caused to communicate with the interior of a heated zone to impinge the vaporized material upon a surface of the substrate.

In order to control the thin-film deposition rate of the vaporized material and fluid emitted from the apparatus that is applied to the substrate, the mass flow rate of the fluid mixture and the velocity of the substrate are controlled while controlling the temperature of the substrate below the condensation point of the vaporized material. As the heated fluid/material mixture impinges onto the cooler substrate, it cools to a temperature below the condensation temperature of the vaporized material. The material condenses from the fluid mixture, in a polycrystalline form, onto the moving substrate as a continuous thin-film layer.

It has been found that thin-film coating systems, based upon the above referred to technologies, are capable of depositing thin-film of cadmium sulfide/cadmium telluride photovoltaic material onto commercially available soda-lime glass substrates in a vacuum and at atmospheric pressure. The photovoltaic materials are subsequently treated to re-crystallize the cadmium telluride surface making the film stack ready for further processing into photovoltaic devices.

However, the described deposition processes under a vacuum and at atmosphere each involve a single pass of the material vapor from a vapor generating system over the substrate to obtain the thin-film thereon. The deposition rate of the material on the substrate is dependent upon the rate of vapor molecules impinging the substrate surface. For single pass deposition, the concentration of vapor molecules must be sufficiently high to achieve the required deposition thickness from at least one stream of vapor from the vapor generating system. However, when the vapor concentration of the material becomes higher than the supersaturation level of the vapor at the operating temperature and pressure of the process, loose dust may form due to vapor phase nucleation of the semiconductor material.

Accordingly, it would be desirable to develop a thin-film photovoltaic material deposition process adapted to minimize the vapor phase nucleation of the semiconductor material during the deposition process to maximize the quality of the thin-film formed on a substrate, while minimizing the cost of production thereof.

SUMMARY OF THE INVENTION

Concordant and congruous with the present invention, a thin-film photovoltaic material deposition process adapted to minimize the vapor phase nucleation of the semiconductor material during the deposition process to maximize the quality of the thin-film formed on a substrate, while minimizing the cost of production thereof, has surprisingly been discovered.

It is an object of the present invention to produce a photovoltaic panel by depositing thin-films of semiconductor materials from a mixture of recirculated chemical vapors and an inert gas on a substrate at atmospheric pressure. The concentration of the vapor before deposition is continuously controlled within the recirculating mixture of the vapor species and an inert gas. The concentration of the vapor impinging on the substrate is maintained according to the temperature-vapor pressure characteristics of the particular semiconductor species in the particular inert gas at atmospheric pressure.

Another object of the present invention is to produce a photovoltaic panel by vaporizing cadmium sulfide and cadmium telluride, recirculating the unused vaporized cadmium sulfide and cadmium telluride, re-heating and sublimating the unused cadmium sulfide and cadmium telluride and depositing the same on the surface of a heated substrate to form a first thin-film of cadmium sulfide and a second thin-film of cadmium telluride at atmospheric pressure.

Another object of the invention is to recover any semiconductor material nucleated from the vapor phase with the recirculating mixture of the semiconductor material vapor material and an inert gas, and returning the nucleated semiconductor material to the vaporizer for conversion back into a vapor.

In one embodiment of the invention, a process for coating a substrate at atmospheric pressure, comprises the steps of vaporizing a controlled mass of semiconductor material at substantially atmospheric pressure within a heated inert gas stream to create a fluid mixture having a temperature above the condensation temperature of the semiconductor material; directing the fluid mixture at substantially atmospheric pressure onto the substrate, the substrate having a temperature below the condensation temperature of the semiconductor material thereby depositing a layer of the semiconductor material onto a surface of the substrate; extracting undeposited semiconductor material; circulating the undeposited semiconductor material into the fluid mixture having a temperature above the condensation temperature; and repeating the steps of vaporizing, directing, depositing, extracting, and circulating to minimize a loss of the undeposited semiconductor material.

BRIEF DESCRIPTION OF THE DRAWING

The above as well as other objects and advantages of the invention will become readily apparent to those skilled in the art from reading the following detailed description of a preferred embodiment of the invention in the light of the accompanying drawings, in which.

DETAILED DESCRIPTION OF THE PREFERRED EMBODIMENT

Figure 1:
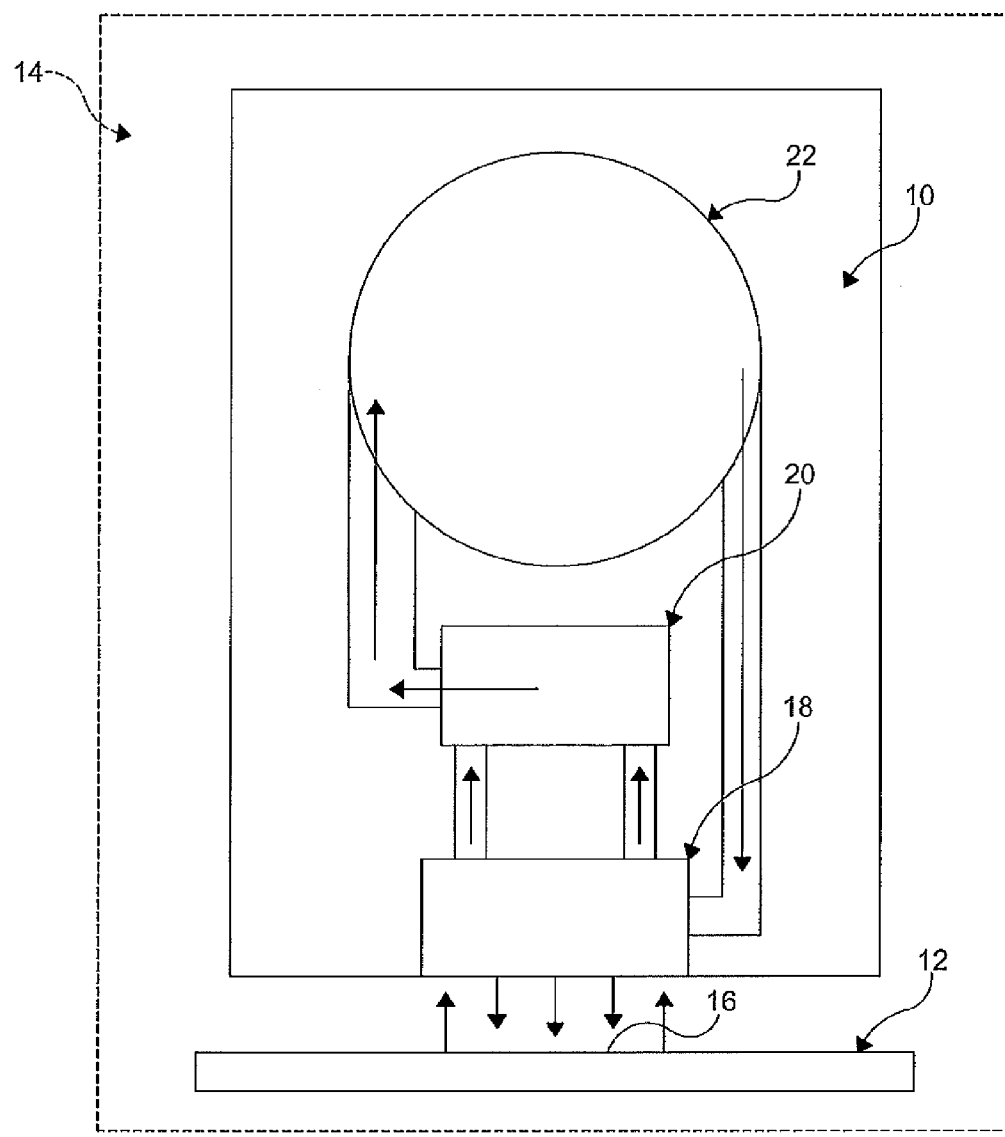
FIG. 1 is a schematic drawing of the recirculation system according to the invention.

Referring to FIG. 1, there is shown a recirculation system 10 for coating a surface of a substrate 12 with a film of semiconductor material, such as cadmium telluride and cadmium sulfide, example, at atmospheric pressure. The recirculation system 10 is preferably maintained in a heated inert gas temperature zone 14 above ambient temperature and at atmospheric pressure.

A known quantity of random sized CdS or CdTe particles is placed into a heated vessel 20 within the system 10. The particles may have any size, but favorable results have been obtained with particles having a size range from about 1 cm diameter to about 5 cm diameter, In the embodiment shown in FIG. 1, the heated vessel 20 is a heated bed. The heated vessel 20 is designed so that a fluid may be recirculated therethrough, and heated to a desired and controlled temperature as it passes therethrough. The desired temperature is a temperature below the temperature at which the semiconductor material will vaporize. By operating the system 10 at the desired temperature, the recirculating fluid (an inert gas/semiconductor material vapor mixture) will, by virtue of the temperature-vapor pressure characteristics shown in FIG. 2, become saturated with the vapors of the semiconductor material, thereby forming a mixture of the vapor and the recirculating sublimated semiconductor material and inert gas. The sublimated semiconductor material and inert gas mixture is discussed in more detail below. The system 10 is operated at the desired temperature and the semiconductor material vapor and inert gas mixture is recirculated through the system as described herein to ensure that the semiconductor material vapor and inert gas mixture remains saturated at the desired temperature.

The saturated fluid mixture is drawn into a recirculation device 22 for delivery to a deposition and extraction head 18 located above the substrate 12 for application to the surface thereof. As shown in FIG. 1, the recirculation device 22 is a mechanical heated fan.

The heated vessel may include a bulk quantity of semiconductor material, or individually metered masses of semiconductor material, preferably cadmium sulfide (CdS) or cadmium telluride (CdTe) in powdered form, may be introduced into the heated vessel 20, which is continuously purged by a stream of heated and inert gas, so that the semiconductor material sublimes at substantially the same rate that the semiconductor material is introduced therein. Metering in a known mass of semiconductor at a known mass flow rate into the heated vessel 20 on a "just in time" basis provides for additional process control and facilitates process cost optimization. The powder is carried from the inlet, by the inert gas flowing at a controlled rate, into the heated vessel 20. The interior of the heated vessel 20 contains a set of low pressure drop, fixed fluid mixing vanes, in which the powder sublimes into a vapor as it passes therethrough, thereby providing mixing of the heated inert gas and the semiconductor material vapor. Alternately, the interior of the heated chamber could comprise a heated packed bed of refractory material media in which the powder sublimes into a vapor as it passes through the interstitial voids of the packed bed's media. The outlet of the heated vessel 20 is in fluid communication with the deposition and extraction zone 16 to facilitate distribution of the vaporized material fluid stream to the substrate 12. Alternative powder vaporization methods through which the metered powder mass and carrier inert gas are heated may be employed for generating the vaporized material fluid stream. The alternative methods may include, but are not necessarily limited to, heated fluidized beds in which the carrier inert gas is heated and the powder is vaporized, thermal "flash" vaporizers that heat the carrier inert gas and vaporize the powder, and atmospheric pressure thermal spray units that heat the carrier inert gas and vaporize the powder.

The fluid mixture of semiconductor material vapor and inert gas is at a temperature above the condensation temperature of the semiconductor material. The temperature of the fluid mixture is typically in a range of from about 500° C. to about 900° C. The heated fluid mixture is then directed into an apparatus for producing a flow of constant controlled velocity toward the surface of a substrate at substantially atmospheric pressure. The velocity of the fluid is controlled by the rotational speed of the heated fan 22. The substrate 12 is typically a soda-lime glass. The soda-lime glass may include a low-E coating that is transparent and electrically conductive. An example of such glass is produced by Pilkington Glass Co. and is designated as TEC-15. The surface of the substrate 12 is at a temperature of from about 400° C. to about 600° C.

The apparatus for producing the desired directed flow of the fluid mixture comprises of a series of individual passageways adapted to cause a series of velocity changes in the transient fluid as the fluid flows through the passageways. The apparatus is maintained above the sublimation temperature of the semiconductor, to prevent condensation of the material within the passageways. Such fluid flow evenly distributes the fluid mixture to an elongate outlet nozzle of a vapor deposition and extraction head 18, and enables uniform flow at constant mass flow distribution to the surface of the substrate 12. The above action causes the molecules of the fluid mixture to be evenly distributed throughout the length of the elongate outlet nozzle, and causes the molecules to travel from the outlet nozzle in a generally parallel path and at a constant velocity, producing a flow of constant velocity and mass distribution directed toward the substrate 12. The velocity of the fluid mixture exiting the outlet nozzle may be regulated by controlling the mass flow rate at which the fluid mixture is introduced at the inlet.

In order to control the thin-film deposition rate of the vaporized material within the fluid emitted from the apparatus being applied to the substrate 12, the mass flow rate of the fluid mixture and the velocity of the substrate 12 are controlled while controlling the temperature of the substrate 12 below condensation point of the sublimed material. As the heated fluid mixture impinges onto the cooler substrate 12, it cools to a temperature below the condensation temperature of the sublimed material. Because the substrate 12 is maintained at a temperature below the condensation of the semiconductor material, as the semiconductor material contacts the substrate 12 the fluid mixture of semiconductor material vapor and inert gas is caused to cool. The semiconductor material condenses from the fluid mixture, in a polycrystalline form, onto the moving substrate 12 as a continuous thin-film layer.

Condensed material that does not form a thin-film layer on the substrate 12 forms dust or other particulate matter that flows or is otherwise dispersed in the deposition and extraction zone 16. The condensed material that does not form the thin-film layer may contaminate the surface of the substrate 12 and the thin-film layer. The system 10 is operated at conditions so that the fluid mixture of semiconductor material vapor and inert gas impinging on the substrate 12 is saturated and follows the "saturated" curve of FIG. 2. The impinging fluid mixture of semiconductor material vapor and inert gas is cooled by contact with the substrate 12, and after contact with the surface of the substrate 12 the fluid mixture is less than fully saturated since material condensed on the surface of the substrate 12 has been removed from the mixture. Thus, after a portion of the semiconductor material has condensed on the surface of the substrate, the fluid mixture comprising the remaining semiconductor material vapor and inert gas is not fully saturated and does not follow the "saturated" curve of FIG. 2, thereby minimizing the amount of semiconductor material that condenses out of the fluid mixture to form a dust. To militate against contamination, the condensed material dust and particulates, along with inert gas, are extracted from the deposition and extraction zone 16 by the deposition and extraction head 18. The condensed dust material is then caused to flow to the heated vessel 20 in which the powder is re-vaporized as it passes through the heated vessel 20. An outlet of the heated vessel 20 is in fluid communication with the heated fan 22. The heated fan 22 causes a mixture of inert gas, re-vaporized material, and previously uncirculated material to flow to the deposition and extraction head 18 to distribute the vaporized material to the substrate 12.

Figure 2:
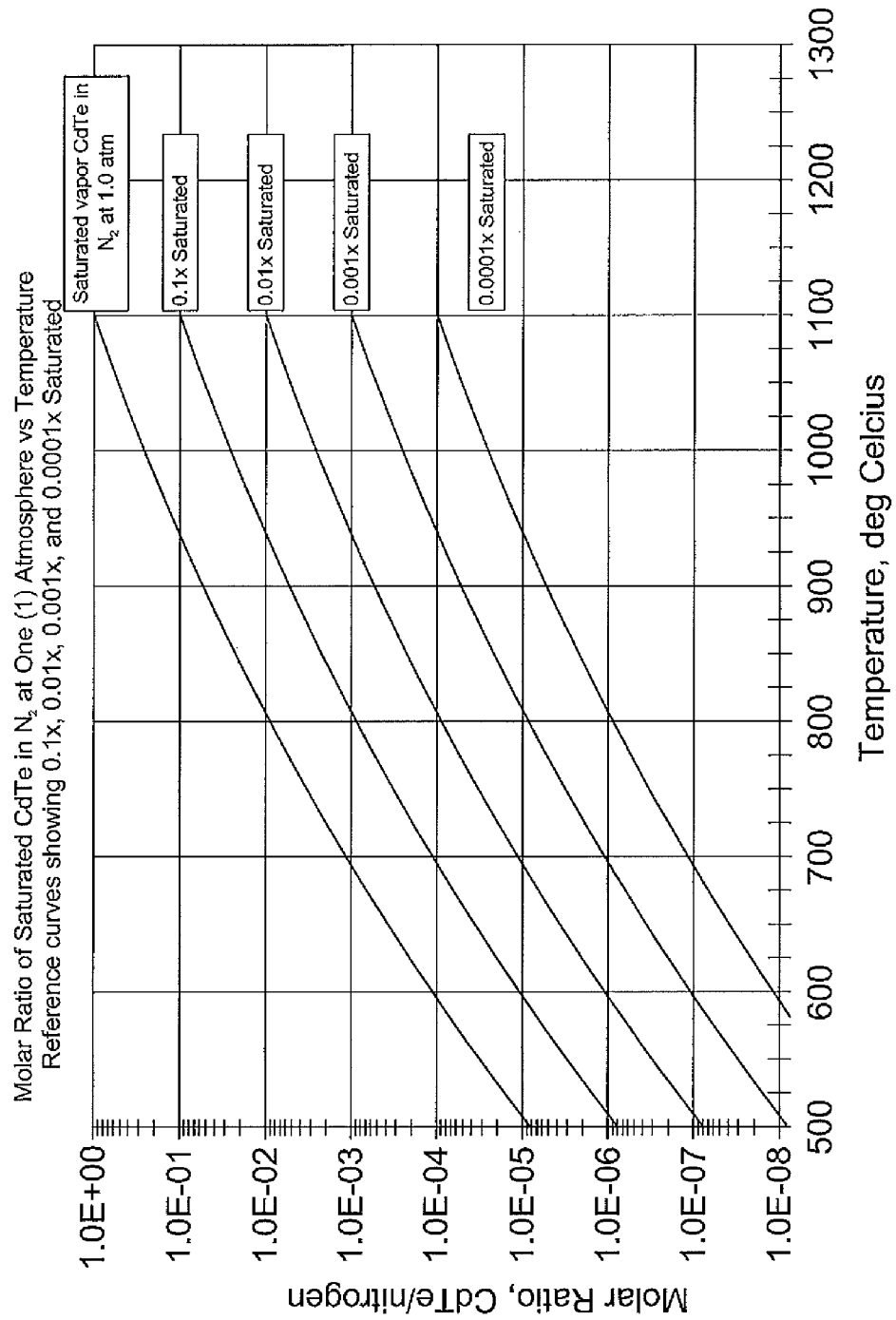
FIG. 2 is a graphical representation of a saturation curve showing the temperature of a semiconductor material versus a ratio of concentration of semiconductor material and concentration of inert gas at atmospheric pressure.

The ratio of molar concentration of the semiconductor material in the vapor phase to molar concentration of inert gas is maintained by controlling the temperature of the mixture as it continuously circulates through the heated fan 22 and the heated vessel 20. The temperature of the fluid mixture is maintained within a range consistent with the known vapor pressure characteristics of the semiconductor so the molar ratio of the semiconductor material vapor and inert gas is controlled, as shown in FIG. 2. The temperature range is below the vaporization temperature of the semiconductor material at one atmosphere pressure. The molar ratio and impingement velocity of the mixture are used to determine the number of molecules of semiconductor material striking the substrate 12 per unit time. Based on the number of molecules of semiconductor material striking the substrate 12 per unit time, the fan 22 is adjusted to maintain a desired rotational speed to maintain a desired recirculation rate. To increase or decrease the number of molecules of semiconductor material striking the substrate 12 per unit time, the rotational speed of the fan 22 is adjusted without adjusting the temperature of the mixture, varying the semiconductor feed rates, and without altering the amount of inert gas fed into the recirculation system 10. Alternatively, the ratio of molar concentrations can be adjusted by the metered powder feed system as described above such that the rate of powder feed is controlled by the rate of recirculation of the semiconductor material vapor and inert gas mixture via a control feedback loop.

While there may be a number of different systems for evenly distributing the semiconductor material vapor and inert gas mixture on the surface of the transient glass substrate 12, it is contemplated that the apparatus illustrated and described in U.S. Pat. No. 4,200,446 to Koontz or U.S. Pat. No. 4,509,526 to Hofer et al. may provide satisfactory results. Other methods include arrays of discrete holes or discrete slots serving as an exit nozzle of the deposition and extraction head 18 as are known to those skilled in the art.

The effectiveness of the deposition of the semiconductor material on the substrate 12 is determined by using the film thickness deposition rate and the molar ratio impingement rate of the mixture. Film thickness deposition rate is determined by the final film thickness on the substrate 12 and the rate at which the substrate 12 moves through the deposition and extraction zone 16. The molar ratio impingement rate is determined from the speed of the fan 22 and the velocity of the mixture from the deposition and extraction head 18 toward the substrate 12. The desired deposition effectiveness is 1.00. However, because the semiconductor material is recovered and recirculated through the system 10, semiconductor material is not lost or wasted thereby maximizing effectiveness. By extracting and recirculating semiconductor material that is not deposited on the substrate 12, the efficiency of the deposition process and the material costs of deposition are minimized. Further, by extracting and recirculating condensed material that is not deposited on the substrate, dust generated during the deposition process is minimized resulting in higher quality thin-film layers.

The deposition of any number of consecutive layers of cadmium sulfide and/or cadmium telluride by the apparatus described above, to prepare a laminar structure, is contemplated by the present invention.

Subsequent to the deposition of a cadmium telluride polycrystalline thin-film, a re-crystallization step would be required to allow the production of photovoltaic devices from the laminar thin-film stack. It has been found that this step can be achieved in less than one minute by subjecting the hot cadmium telluride film to a hot gaseous atmosphere of dilute hydrogen chloride in nitrogen at substantially one atmosphere of pressure. However, it is understood that this step may be achieved in any time frame based on varying process conditions and other process design considerations. The ability to control the re-crystallization of the cadmium telluride while maintaining the temperature of the substrate 12 eliminates cool-down and re-heating of the substrate/film-stack assembly during the re-crystallization step. The use of a "dry" re-crystallization step eliminates the use of a toxic cadmium chloride solution and its application apparatus. Typically, a glass substrate exiting the in-line re-crystallization process would have a temperature from about 620° C. to about 630° C. This temperature range allows the glass to be thermally tempered by cool quenching gas flows as the substrate/film-stack exits the processing line.

The above-described process relates to a method for producing a thin-film cadmium sulfide/cadmium telluride photovoltaic material on the surface of a soda-lime glass substrate, to provide large area photovoltaic panels. However, it must be understood that the concept of atmospheric vapor deposition can be extended to include other thin-film materials that are normally deposited in a vacuum.

Thin-film photovoltaic materials that could be considered are CIGS (copper-indium-gallium-diselenide), CdS/CIS-alloy (cadmium sulfide/copper-indium-selenium alloy), amorphous silicon or thin-film polycrystalline silicon, and $Zn(O,S,OH)_x$/CIGS (zinc oxide sulfide hydroxide/copper-indium-gallium-diselenide).

Other thin-film materials that can be considered for application to glass substrates are optical coatings such as multi-layer stacks used for very low emissivity films and anti-reflection films. Other value added features such as improved durability films, self-cleaning films, photo-optic, and electro-optic films could be developed using the inventive atmospheric pressure deposition concept.

The process of atmospheric pressure deposition of thin-film materials could be applied to a variety of substrate materials for enhancement of their surface properties. Substrates that could be considered include polymeric materials, ceramics, metals, wood, and others.

What is claimed is:

1. A process for coating a substrate heated to a temperature below the condensation temperature of a semiconductor material at atmospheric pressure, comprising the steps of:
   mixing a mass of semiconductor material and a heated inert gas stream;
   vaporizing the semiconductor material in the heated inert gas stream to create a fluid mixture having a temperature above the condensation temperature of the semiconductor material;
   directing the fluid mixture at the substrate, wherein the substrate is at substantially atmospheric pressure;
   depositing a layer of the semiconductor material onto a surface of the substrate;
   extracting undeposited semiconductor material;
   circulating the undeposited semiconductor material into the fluid mixture; and
   repeating the steps of generating, directing, depositing, extracting, and circulating to minimize an amount of undeposited semiconductor material.

2. The process according to claim 1, wherein the semiconductor material is one of cadmium sulfide and cadmium telluride.

3. The process according to claim 1, wherein the inert gas is nitrogen.

4. The process according to claim 1, wherein the temperature of the fluid mixture ranges from about 500 degrees C. to about 900 degrees C.

5. The process according to claim 1, wherein the substrate comprises glass.

6. The process according to claim 5, wherein the glass includes a transparent, electrically conductive coating.

7. The process according to claim 1, wherein the substrate has a temperature ranging from about 400 degrees C. to about 600 degrees C.

8. The process according to claim 1, wherein the steps of vaporizing, directing, and depositing are repeated at least once, to deposit at least one additional layer of semiconductor material on the substrate.

9. The process according to claim 1, wherein the fluid mixture is saturated.

10. The process according to claim 1, further comprising a step of providing a recirculation device for mixing and circulating the controlled mass of semiconductor material, the heated inert gas stream, and the undeposited semiconductor material.

11. The process according to claim 10, wherein the recirculation device is a heated fan.

12. The process according to claim 1, wherein a metered mass of semiconductor material is mixed with the heated inert gas to form the fluid mixture.

13. The process according to claim 1, providing a bulk quantity of semiconductor material for mixing with the heated inert gas to form the fluid mixture.

14. The process according to claim 1, wherein the bulk quantity of semiconductor material is provided in a heated packed bed of refractory material media.

15. The process according to claim 1, further comprising a step of maintaining a desired molar ratio of semiconductor material and inert gas in the fluid mixture to minimize an amount of undeposited semiconductor material.

16. A process for coating a substrate heated to a temperature below the condensation temperature of a semiconductor material at atmospheric pressure, comprising the steps of:
   metering a desired mass of semiconductor material into a heated inert gas;
   vaporizing the semiconductor material in the heated inert gas stream to create a saturated fluid mixture having a temperature above the condensation temperature of the semiconductor material;
   directing the saturated fluid mixture at the substrate, wherein the substrate is at substantially atmospheric pressure;
   depositing a layer of the semiconductor material onto a surface of the substrate;
   extracting undeposited semiconductor material;
   circulating the undeposited semiconductor material into the saturated fluid mixture;
   repeating the steps of generating, directing, depositing, extracting, and circulating to minimize an amount of undeposited semiconductor material.

17. The process according to claim 16, further comprising a step of maintaining a desired molar ratio of semiconductor material and inert gas in the fluid mixture to minimize an amount of undeposited semiconductor material.

18. The process according to claim 16, further comprising a step of providing a recirculation device for mixing and circulating the controlled mass of semiconductor material, the heated inert gas stream, and the undeposited semiconductor material.

19. A process for coating a substrate heated to a temperature below the condensation temperature of a semiconductor material at atmospheric pressure, comprising the steps of:
   mixing a mass of semiconductor material and a heated inert gas stream;
   vaporizing the semiconductor material in the heated inert gas stream to create a saturated fluid mixture having a temperature above the condensation temperature of the semiconductor material;

directing the fluid mixture at the substrate, wherein the substrate is at substantially atmospheric pressure;
depositing a layer of the semiconductor material onto a surface of the substrate; and
extracting undeposited semiconductor material to minimize particulate deposition on the heated substrate.

20. The process according to claim 19, further comprising a step of circulating the undeposited semiconductor material into the fluid mixture.

* * * * *